United States Patent
Chih

(10) Patent No.: US 7,420,845 B2
(45) Date of Patent: Sep. 2, 2008

(54) HIGH-ENDURANCE MEMORY DEVICE

(75) Inventor: Yue-Der Chih, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/701,886

(22) Filed: Feb. 2, 2007

(65) Prior Publication Data

US 2008/0186774 A1    Aug. 7, 2008

(51) Int. Cl.
*G11C 16/06* (2006.01)
(52) U.S. Cl. .............. 365/185.21; 365/185.09; 365/185.2
(58) Field of Classification Search ........... 365/185.21, 365/185.09, 185.2
See application file for complete search history.

(56) References Cited

U.S. PATENT DOCUMENTS 7,180,795 B1 *   2/2007   Chan et al. ............ 365/189.09

* cited by examiner

*Primary Examiner*—Huan Hoang
(74) *Attorney, Agent, or Firm*—K & L Gates LLP

(57) ABSTRACT

A memory device includes a set of memory cells, each of which is capable of being selected to generate a sensing current depending on a logic state thereof, and a set of reference cells, each of which is capable of being selected to generate a reference current. A sense amplifier is coupled to the memory cells and the reference cells for comparing the sensing current with the reference current to generate a signal representing the logic state of the selected memory cell. The memory cells and the reference cells are subject to the same operation cycles, such that a difference between the sensing current and the reference current remains a constant.

16 Claims, 3 Drawing Sheets

HIGH-ENDURANCE MEMORY DEVICE

BACKGROUND

The present invention relates generally to integrated circuit (IC) designs, and more particularly to a high-endurance memory device.

A flash memory device is typically comprised of a memory cell array for storing data even when the device is not connected to electric power. Each memory cell of the array can be selected for an erasing operation or programming operation. If the memory cell is erased, it will have a low threshold voltage, thereby generating a high sensing current. If the memory cell is programmed, it will have a high threshold voltage, thereby generating a low sensing current. A sense amplifier compares the sensing current with a reference current to determine whether the sensing current is high or low, and therefore determines whether the cell is erased or programmed.

The memory cells degrade over cycles of operation. An operation cycle is defined as when a memory cell is programmed and erased once. For each cycle, electrons are driven across a gate dielectric layer of the memory cell. This causes incremental damage to the gate dielectric layer. As a result, the degradation of the memory cells is proportional to the number of operation cycles.

One drawback of the conventional flash memory device is that the sensing margin of the memory cells decreases as they degrade over operation cycles. As the memory cell degrades, its sensing current decreases, while the reference current remains a constant. The sensing margin is defined as the difference between the sensing current and the reference current. Thus, after many cycles of operations, the sensing margin may become so small that the logic states of the memory cells can no longer be detected accurately.

As such, what is needed is a memory device with a sensing margin that is not reduced as the memory cells degrade.

SUMMARY

The present invention discloses a memory device. In one embodiment of the invention, the memory device includes a set of memory cells, each of which is capable of being selected to generate a sensing current depending on a logic state thereof, and a set of reference cells, each of which is capable of being selected to generate a reference current. A sense amplifier is coupled to the memory cells and the reference cells for comparing the sensing current with the reference current to generate a signal representing the logic state of the selected memory cell. The memory cells and the reference cells are subject to the same operation cycles, such that a difference between the sensing current and the reference current remains a constant.

The construction and method of operation of the invention, however, together with additional objects and advantages thereof will be best understood from the following description of specific embodiments when read in connection with the accompanying drawings.

DESCRIPTION

Figure 1:
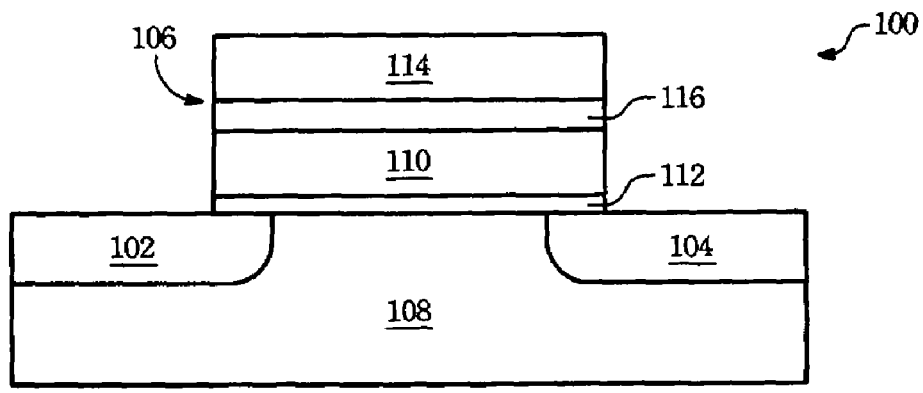
FIG. 1 illustrates a cross-sectional view of a conventional floating gate memory cell.

FIG. 1 illustrates a cross-sectional view of a floating gate memory cell 100 in a conventional flash memory device. The cell 100 is comprised of a source regions 102, drain region 104 and gate structure 106 overlying a semiconductor substrate 108. The gate structure 106 includes a floating gate 110 separated from the substrate 108 by a gate dielectric layer 112. The gate structure 106 also includes a control gate 114 separated from the floating gate 110 by an insulating layer 116. During a programming operation, the control gate 114 is connected to a positive voltage, the drain 104 is connected to a positive voltage, and the source 102 is connected to ground. This creates an electric field that drives channel hot electrons into the floating gate 110 across the gate dielectric layer 112. During an erasing operation, the control gate 114 is connected to a negative voltage, the drain 104 and source 102 are floating, and the substrate 108 is connected to a positive voltage. The electrons trapped in the floating gate 110 are pulled into the substrates 108 across the gate dielectric layer 122 by means of Fowler-Nordheim tunneling. The number of electrons trapped in the floating gate 110 determines the logic state of the cell 100.

Figure 2:
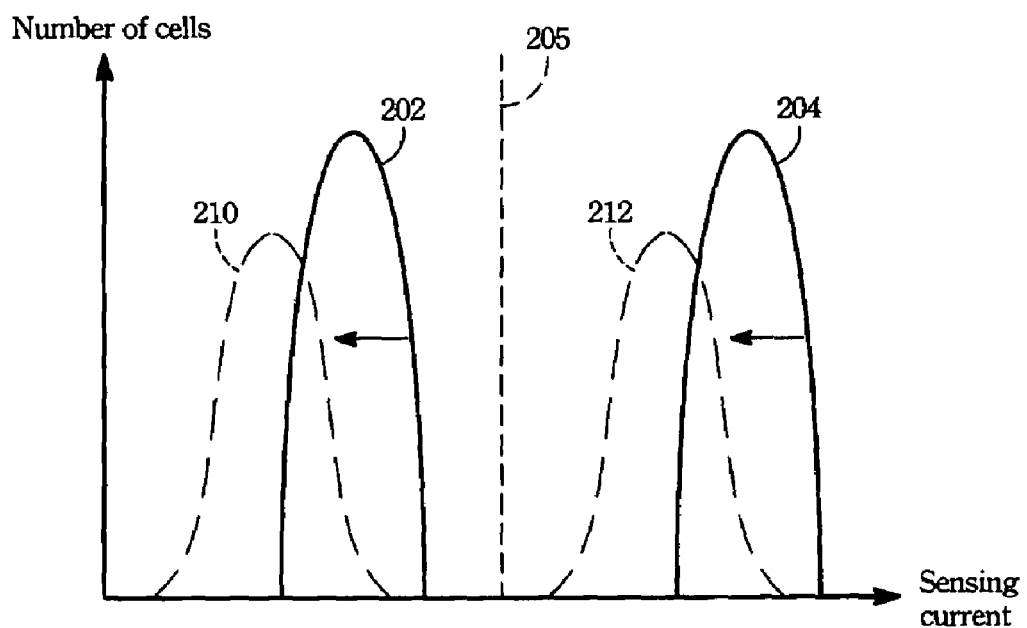
FIG. 2 illustrates distribution curves for a conventional memory device.

FIG. 2 illustrates distribution curves for a conventional memory device. The x-coordinate denotes the intensity of sensing current, and the y-coordinate denotes the number of memory cells. The curve 202 represents the distribution of the memory cells at programmed sates. The curve 204 represents the distribution of the memory cells at erased states. A line 205 between the curves 202 and 204 represents a reference current. During a read operation, at least one memory cell is selected to generate a sensing current. If the sensing current is greater than the reference current, a signal is generated to indicate that the selected memory cell is at the erased state. If the sensing current is smaller than the reference current, a signal is generated to indicate that the selected memory cell is at the programmed state.

One drawback of the conventional memory device is that the logic state of the memory cell may be read incorrectly after it operates for many cycles. For each operation cycle, the gate dielectric layer of a memory cell deteriorates as electrons pass thereacross back and forth. This causes the curves 202 and 204 to shift to the left, becoming curves 210 and 212, respectively. Conventionally, the reference current is independent from the operation cycles. Thus, the sensing margin, which is defined as the difference between the reference current and the sensing current, is reduced as the memory cell degrades.

Another drawback of the conventional memory device is that the memory cells in a memory device may have different frequencies of operation. After a number of operation cycles, some cells may degrade more than others. This causes the curves 202 and 204 to become wider curves 210 and 212, respectively. Thus, it may further reduce the sensing margin.

Figure 3:
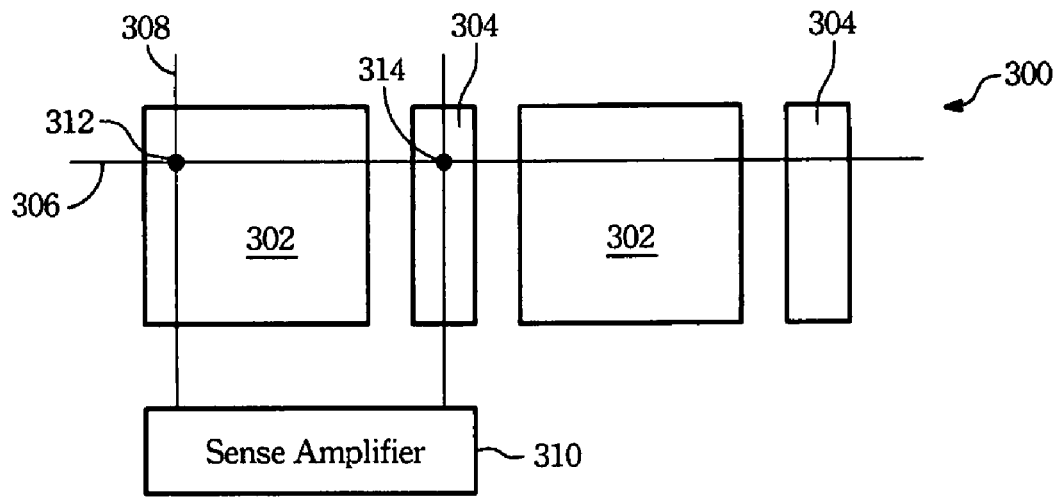
FIG. 3 illustrates a memory array 300 of a memory device in accordance with one embodiment of the present invention.

FIG. 3 illustrates a memory array 300 of a memory device in accordance with one embodiment of the present invention. The memory array 300 includes one or more sub-arrays 302 of memory cells, which are customarily referred to as pages by people skilled in the art of memory technology. One or more reference cell arrays 304 are arranged adjacent to the sub-arrays 302. The sub-arrays 302 and reference arrays 304 are addressed by one or more word lines 306 and bit lines 308.

Each word line 306 is connected to a row of memory cells and at least one corresponding reference cell. Each bit line is connected to a column of memory cells or a column of reference cells. The bit lines 308 running through the sub-array 302 and the reference cell array 304 are connected to a sense amplifier 310.

During a read operation, at least one memory cell 312 and its corresponding reference cell 314, which is connected to the same word line 306 as the memory cell 312, are selected to generate a sensing current and a reference current, respectively. The sense amplifier 310 compares the sensing current and the reference current to determine the logic state of the selected memory cell 312. If the sensing current is greater than the reference current, the sense amplifier 310 will generate a signal to indicate that the selected memory cell 312 is at an erased state. If the sensing current is smaller than the reference current, the sense amplifier 310 will generate a signal to indicate that the selected memory cell 312 is at a programmed state.

In this embodiment, all of the memory cells in each sub-array 302 are subject to the same cycles of operation. Thus, after many cycles of operation, the sensing current distribution curve of the sub-array 302 remains in the same shape as all the cells deteriorate at, the same rate. Furthermore, the reference cell array 304 is also subject to the same cycles of operation as the sub-array 302. Thus, the reference cell 314 deteriorates at the same rate as memory cells in the sub-array 302. This ensures that the sensing current distribution curve and the reference current shift by the same amount of value at any given number of operation cycles. As such, the sensing margin can be maintained at a constant level as the memory device degrades.

Figure 4:
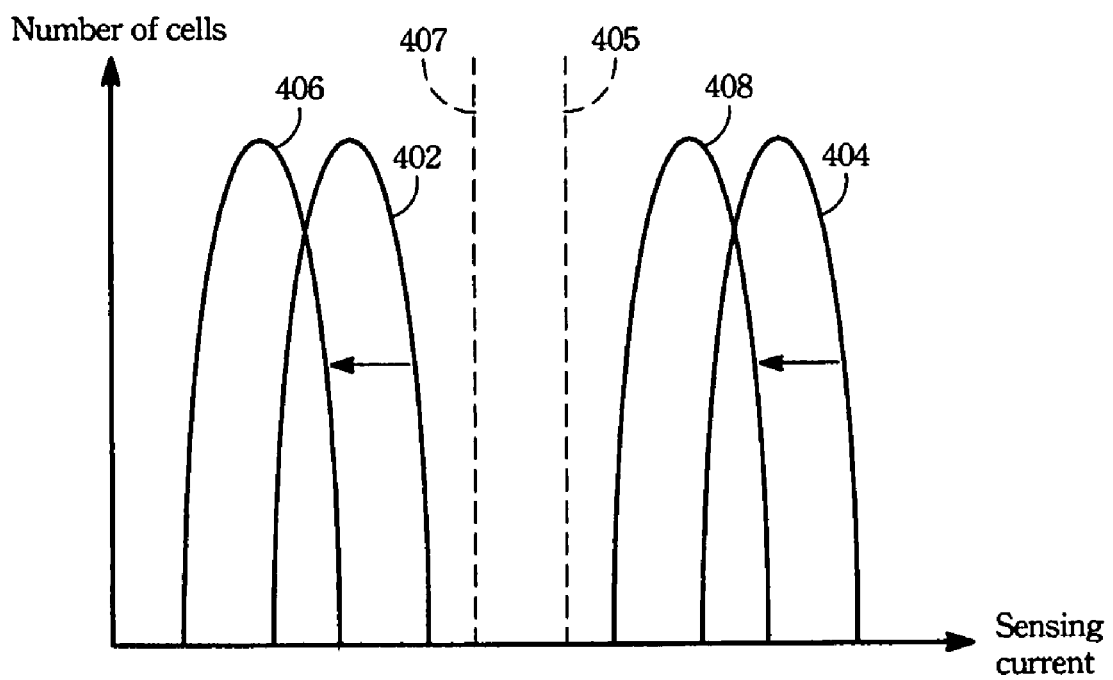
FIG. 4 illustrates distribution curves for a memory device in accordance with one embodiment of the present invention.

FIG. 4 illustrates distribution curves for a memory device in accordance with one embodiment of the present invention. The x-coordinate denotes the intensity of sensing current, and the y-coordinate denotes the number of memory cells. The curve 402 represents the distribution of the memory cells at programmed sates. The curve 404 represents the distribution of the memory cells at erased states. A line 405 between the curves 402 and 404 represents a reference current. The sensing margin is defined as the difference between the reference current 405 and the sensing current 404.

After the memory device operates for a certain number of cycles, the curves 402 and 404 shift to the left, becoming curves 406 and 408; respectively. In this embodiment, the reference current represented by the line 405 also shifts to the left, becoming a line 407. Since the reference cells and the memory cells are subject to the same operation cycles, the distance between the lines 405 and 407 would be the same as the distance between curves 404 and 408. As such, the sensing margin remains a constant.

Figure 5:
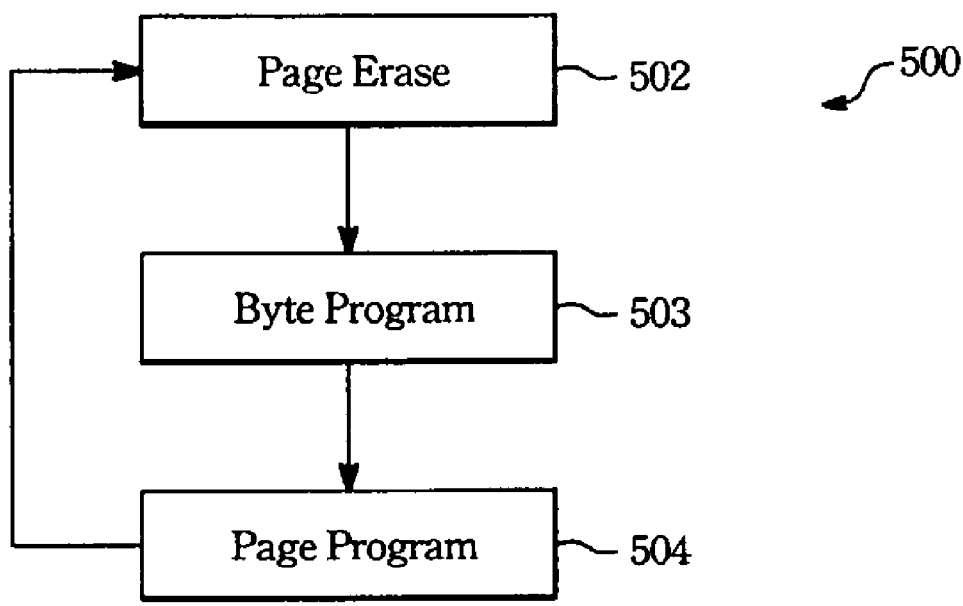
FIG. 5 illustrates an operation steps for the memory device in accordance with the embodiment of the present invention.

FIG. 5 illustrates a method 500 for subjecting the reference cells and memory cells to the same operation cycles. As mentioned above, each operation cycle is defined as having a cell erased and programmed once. For each cycle, a page erasing operation is performed to erase all the data stored in a sub-array at step 502. A number of memory cells are selected for being programmed with certain values at step 504. The values will remain in the selected memory cells until the next operation cycle. Before the page erasing operation is executed for the next operation cycle, the initially unselected memory cells and the reference cells are selected to be programmed at step 506. The values written into the initially unselected memory cells and the reference cells are not meaningful or useful in a sense. However, this ensures that all the memory cells and reference cells are subject to the same operation cycles. As such, the sensing margin can be maintained at a constant level.

It is noted that the memory device can be any type of non-volatile memory devices, such as floating gate memory devices, mirror bit memory devices, and other multiple bit memory devices. Thus, the invention is by no means limited to the floating gate memory device as it is used as an example merely for purposes of description.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A memory device comprising:
   a set of memory cells, each of which is capable of being selected to generate a sensing current depending on a logic state thereof;
   a set of reference cells, each of which is capable of being selected to generate a reference current, wherein the set of the memory cells and the reference cells are entirely erased before one or more of the memory cells are selected for a programming operation; and
   a sense amplifier coupled to the memory cells and the reference cells for comparing the sensing current with the reference current to generate a signal representing the logic state of the selected memory cell,
   wherein the memory cells that have not been selected for the programming operation are successively programmed before a page erase operation is executed, and
   wherein the memory cells and the reference cells are subject to the same operation cycles, such that a difference between the sensing current and the reference current remains a constant.

2. The memory device of claim 1 wherein the set of memory cells and the reference cells are addressed by a plurality of word lines and bit lines.

3. The memory device of claim 2 wherein each of the word lines is connected to at least one corresponding reference cell.

4. The memory device of claim 2 wherein the bit lines are connected to the sense amplifier.

5. The memory device of claim 1 wherein the set of memory cells have the same operation cycles.

6. The memory device of claim 1 wherein the reference cells are programmed before the erase operation is executed.

7. The memory device of claim 1 is a non-volatile memory device.

8. A method for maintaining a sensing margin of a memory device, comprising:
   selecting at least one memory cell from a set of memory cells to generate a sensing current depending on a logic state of the selected memory cell;
   selecting at least one reference cell from a set of reference cells to generate a reference current;

erasing the memory cells and the reference cells entirely before one or more of the memory cells are selected for a programming operation;

programming the memory cells that have not been selected for the programming operation before a page erase operation is executed; and comparing the sensing current with the reference current to generate a signal representing the logic state of the selected memory cell, wherein the memory cells and the reference cells are subject to the same operation cycles, such that a difference between the sensing current and the reference current remains a constant.

9. The method of claim 8 wherein the set of memory cells have the same operation cycles.

10. The method of claim 8 further comprising programming the reference cells before the page erase operation is executed.

11. The method of claim 10 wherein the memory device is a non-volatile memory device.

12. A memory device comprising:

a set of memory cells, each of which is capable of being selected to generate a sensing current depending on a logic state thereof;

a set of reference cells, each of which is capable of being selected to generate a reference current; and a sense amplifier coupled to the memory cells and the reference cells for comparing the sensing current with the reference current to generate a signal representing the logic state of the selected memory cell, wherein the set of the memory cells and the reference cells are entirely erased before one or more of the memory cells are selected for a programming operation, wherein the reference cells and the memory cells that have not been selected for the programming operation are successively programmed before a page erase operation is executed, thereby maintaining a difference between the sensing current and the reference current at a constant value.

13. The memory device of claim 12 wherein the set of memory cells and the reference cells are addressed by a plurality of word lines and bit lines.

14. The memory device of claim 13 wherein each of the word lines is connected to at least one corresponding reference cell.

15. The memory device of claim 13 wherein the bit lines are connected to the sense amplifier.

16. The memory device of claim 12 is a non-volatile memory device.

* * * * *